United States Patent [19]

Hochstrate

[11] 4,255,722
[45] Mar. 10, 1981

[54] VOLTAGE CONTROLLED MULTIVIBRATOR HAVING VARIABLE FREQUENCY AND DUTY CYCLE

[75] Inventor: Paul E. Hochstrate, Bristol, Conn.

[73] Assignee: Timex Corporation, Waterbury, Conn.

[21] Appl. No.: 69,159

[22] Filed: Aug. 23, 1979

[51] Int. Cl.³ .............................................. H03K 3/282
[52] U.S. Cl. .............................. 331/113 R; 331/177 R
[58] Field of Search ............... 331/111, 113 R, 177 R, 331/144

[56] References Cited

U.S. PATENT DOCUMENTS

| | | | |
|---|---|---|---|
| 3,210,691 | 10/1965 | Sprott | 331/113 R |
| 3,587,002 | 6/1971 | Brown | 331/177 R X |
| 3,901,247 | 8/1975 | Walmsley | 331/113 R X |

Primary Examiner—Siegfried H. Grimm

[57] ABSTRACT

A voltage controlled oscillator (VCO) to produce a variable frequency and duty cycle output proportional to the applied (input) voltage. The VCO comprises RC charge networks to vary both the frequency and duty cycle of an astable multivibrator with applied voltage variations. The VCO has particular application for low voltage and low frequency operation.

11 Claims, 2 Drawing Figures

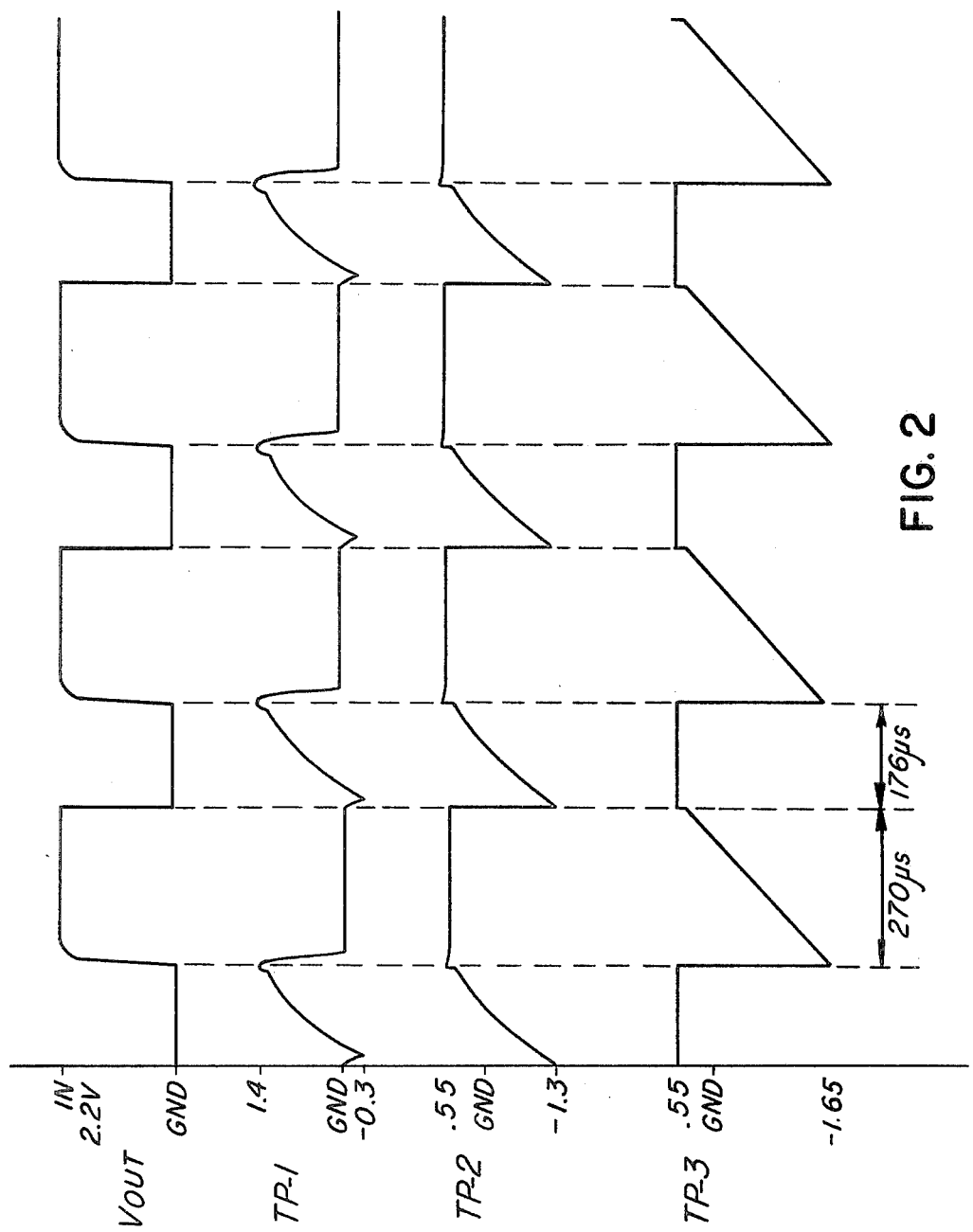

VOLTAGE CONTROLLED MULTIVIBRATOR HAVING VARIABLE FREQUENCY AND DUTY CYCLE

BACKGROUND OF THE INVENTION

This invention relates generally to voltage controlled oscillator circuits. It is particularly directed to the provision of a voltage controlled oscillator for use in low voltage devices such as electronic timepieces, to produce voltage pulses having a frequency and duty cycle which varies in proportion to the applied voltage.

VCO circuits produce output signals whose frequency varies as a function of an input control voltage. VCOs are useful in systems employing phase locked loops (PLL) as well as in any system where a variable frequency output signal is required as a function of the input signal. A VCO circuit employing cascaded inverters connected in a ring configuration to form a ring oscillator is described, for example, in U.S. Pat. No. 3,931,588 entitled "Voltage Controlled Oscillator Utilizing Field Effect Transistors" issued Jan. 6, 1976 to W. S. Gehweiler. In this reference the frequency of the ring oscillator is varied, over the relatively high operating range of approximately 6 MHZ to 21 MHZ, by varying the operating voltage applied across at least one of the inverting stages of the oscillator.

A VCO circuit employing cascaded inverters to form an astable multivibrator is described, for example, in U.S. Pat. No. 3,878,482 entitled "Wide Band Voltage Controlled Oscillator Utilizing Complementary Metal Oxide Semiconductors Integrated Circuits And A Constant Current MOS Field Effect Transistor" issued to L. F. Schowe, Jr. In this reference, the operating current and voltage is applied to a complementary inverter where a transistor of P conductivity type functions as a current source. As the conduction of the P type transistor is varied more or less current flows into the inverter.

Other prior art patents of interest include U.S. Pat. Nos. 4,156,204 issued May 22, 1979 to Robert N. Hargis; 3,911,378 issued Oct. 7, 1975 to James E. Buchanan; 4,072,910 issued Feb. 7, 1978 to Andrew Gordon Francis Dingwall et al.; 4,146,849 issued Mar. 27, 1979 to Kouichirou Satou; and 3,919,625 issued Nov. 11, 1975 to Troyce D. Barton.

In contrast to the prior art, the present invention provides a VCO circuit which varies both frequency and duty cycle as a function of the applied voltage, provides an output voltage/current source which varies inversely to the applied (input) voltage and has particular application for low voltage and low frequency operation.

SUMMARY OF THE INVENTION

Essentially, and in accordance with the invention, the VCO is designed for relatively low voltage and low frequency operation by use of two RC networks responsive to the applied voltage to control the operation of an astable multivibrator to produce an output (pulse) whose frequency and duty cycle varies with the applied voltage over a predetermined range and the output voltage/current (pulse) source varies inversely to the applied input voltage variations.

It is, therefore, an object of the present invention to provide a VCO suitable for relatively low voltage and low frequency operation.

It is a further object of the present invention to provide a VCO which is responsive to the applied voltage to produce a variable frequency and variable duty cycle pulsed signal output.

It is another object of this invention to provide a circuit responsive to variations in the applied voltage for providing a controlled drive pulse and/or variable duty cycle pulse (power) source which varies inversely to the variations of the applied input voltage.

Further advantages and objectives of the present invention will be apparent from the following detailed description of the preferred embodiment of the invention.

BRIEF DESCRIPTION OF THE DRAWINGS

FIG. 2 is a set of waveforms for illustrating the operation of the FIG. 1 circuit.

DETAILED DESCRIPTION OF THE INVENTION

Figure 1:
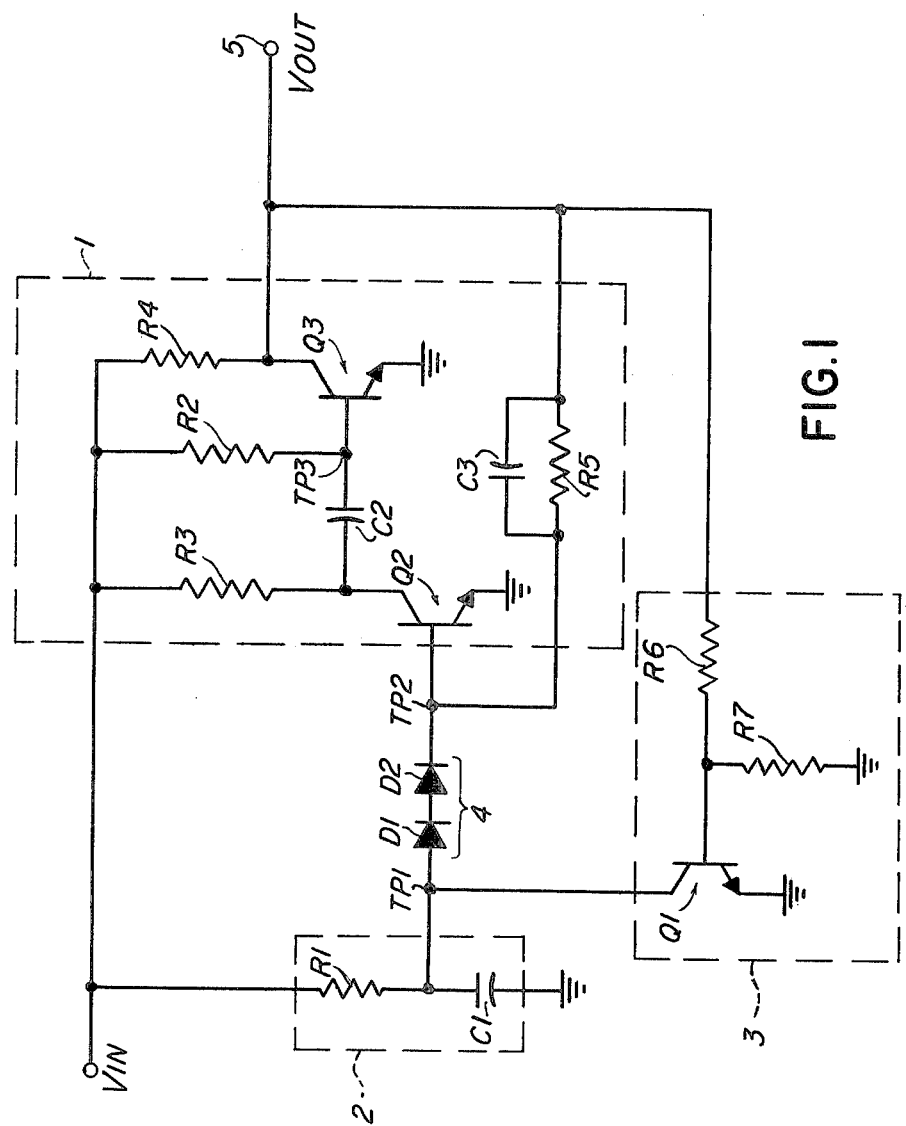
FIG. 1 is a circuit diagram of the VCO circuit according to the invention.

The following is a detailed description of the best presently contemplated mode of carrying out the invention. This description is not to be taken in a limiting sense but is made merely for the purpose of illustrating general principles of the invention since the scope of the invention is best defined by the appended claims.

Referring now to FIGS. 1 and 2, the variable controlled oscillator circuit comprises an astable multivibrator 1 (shown within a phantom outline), an RC charge network 2, a discharge network 3 (also shown within a phantom outline), and a threshold network 4.

The applied input voltage $V_{in}$ is selected to vary from approximately 2.2 to 5 volts DC.

The astable multivibrator 1 comprises two NPN type transistors $Q_2$, $Q_3$ connected in cascade, a feedback network $R_5C_3$ and an RC network $R_2C_2$ connected between the two transistors $Q_2$, $Q_3$. The collectors of transistors $Q_2$, $Q_3$ are coupled to the applied voltage $V_{in}$ through resistors $R_3$ and $R_4$, respectively. The feedback network $C_3R_5$ is connected between the collector of transistor $Q_3$ and the base or gate terminal of transistor $Q_2$.

The emitters of transistors $Q_2$, $Q_3$ are returned to a reference (ground) potential. The common junction between resistor $R_4$ and the collector of transistor $Q_3$ forms the output terminal 5 of the VCO. As noted above, the output terminal 5 is connected to the input of the multivibrator 1, i.e., to the base transistor of $Q_2$, via the feedback network $C_3R_5$. The feedback network $C_3R_5$ couples (in a bootstrap like manner) a sustaining signal from the output terminal 5 to the base of $Q_2$ to maintain conduction of transistor $Q_2$ during a logic 1 or high output from the multivibrator 1. The output of the multivibrator 1 is also coupled to a discharge network 3. The discharge network 3 comprises transistor $Q_1$ and resistors $R_6$ and $R_7$. Transistor $Q_1$ serves as a switch actuated by the output pulse from the multivibrator 1 to discharge capacitor $C_1$ to the reference potential.

The RC charge network 2, comprises a series RC circuit connected between the reference potential and the applied voltage $V_{in}$. The common junction between resistor $R_1$ and capacitor $C_1$ is coupled to the collector of transistor $Q_1$ and, via threshold network 4, to the base of transistor $Q_2$. The threshold or voltage trigger network 4 comprises two diodes $D_1$, $D_2$ connected in series between the base of transistor $Q_2$ and the common junction of resistor $R_1$ and capacitor $C_1$.

The circuit was designed to produce a variable duty cycle and variable frequency such that at the lowest voltage the duty cycle is predetermined at approximately 50% and the frequency is approximately 1000 hertz. As the voltage increases towards the maximum, the duty cycle decreases to about 25% and the frequency approaches 2000 hertz.

The astable multivibrator is triggered into oscillation when the voltage at terminal TP2 approaches the predetermined threshold voltage of diodes $D_1$, $D_2$, and $Q_2$'s emitter base junction, which is predetermined at approximately 1.8 volts.

The pulse width PW of the output signal Vout is determined by the charge time of the RC network $R_2C_2$ and the $V_{in}$ potential level such that a predetermined voltage is established on terminal TP3 to turn off transistor $Q_3$. With $Q_3$ turned off, i.e., not conducting, output terminal 5 is at the $V_{in}$ potential.

The duration of the logic 0 or reference potential GND portion of the output signal Vout is primarily determined by the charge time of the RC charge network 2 and the $V_{in}$ potential level whereby a predetermined (trigger) voltage is established on terminal TP2 to turn on transistor $Q_2$.

Therefore, since the applied voltage is predetermined to vary over a fixed range, the time constant to reach the trigger voltages on $C_1$ and $C_2$ will vary in accordance with the applied voltage $V_{in}$. And as noted above, the pulse width PW is controlled by the RC network $R_2$, $C_2$ and the logic 0 portion of the output signal Vout is determined by the RC charge network $R_1$, $C_1$. In this manner, as the $V_{in}$ voltage increases, the RC networks charge to the predetermined (trigger) voltages in a shorter period of time which in turn controls the frequency and duty cycle of the output wave form Vout.

In operation, the circuit functions as follows: When power is first applied, transistor $Q_3$ conducts because it is forwarded biased through $R_3$. Transistor $Q_1$ is cutoff because the collector of transistor $Q_3$ approaches ground and back biases transistor $Q_1$ through $R_6$ and $R_7$. Transistor $Q_2$ is cutoff due to the back bias established by the collector of transistor $Q_3$ and $R_5$. The RC charge network 2 begins to charge up toward the applied voltage $V_{in}$ until the threshold of $D_1$ and $D_2$ and the emitter base of transistor $Q_2$ is overcome (about 1.8 volts). Once transistor $Q_2$ starts to conduct, capacitor $C_2$ couples the negative going voltage to the base of transistor $Q_3$, cutting off transistor $Q_3$. Transistor $Q_3$ will be held cutoff until capacitor $C_2$ charges up through transistor $Q_2$ and resistor $R_3$. When transistor $Q_3$ cuts off, transistor $Q_1$ conducts shunting out capacitor $C_1$; transistor $Q_1$ is cutoff when transistor $Q_3$ once again conducts. The feedback circuit $R_5C_3$ maintains transistor $Q_2$ conducting until transistor $Q_3$ conducts once again.

While a wide variety of types of transistors and associated elements may be employed, the VCO circuit embodiment illustrated in FIG. 1 was constructed and successfully operated to provide the results indicated in Table 2 using the following components.

TABLE 1

| | DIODE | | |
|---|---|---|---|
| $Q_1$, $Q_2$, $Q_3$ | = Texas Instrument' 2N4401 | $D_1$, $D_2$ | = Texas Instruments' 1N914 |
| $R_1$, $R_6$, $R_7$ | = 33K - ohms | $C_1$ | = 0.001 microfarads |
| $R_3$, $R_4$ | = 4.7K - ohms | $C_2$ | = 0.005 microfarads |
| $R_2$ | = 47K - ohms | $C_3$ | = 0.0033 microfarads |

TABLE 1-continued

| | DIODE | | |
|---|---|---|---|
| $R_5$ | = 100K - ohms | | |

TABLE 2

| IN | TP-1 | TP-2 | TP-3 | TIME @ Gnd MICROSECONDS | TIME @ $V_{in}$ MICROSECONDS | DUTY CYCLE % ON | FREQ. K. HZ |
|---|---|---|---|---|---|---|---|
| 2.2V | +1.4 / −0.3 | +.55 / −1.3 | +.55 / −1.65 | 176 | 270 | 60 | 2.25 |
| 2.5V | +1.5 / −0.4 | +.55 / −1.5 | +.55 / −1.9 | 152 | 265 | 64 | 2.4 |
| 3.0V | +1.5 / −0.6 | +.55 / −1.8 | +.55 / −2.3 | 130 | 260 | 67 | 2.56 |
| 3.5V | +1.55 / −0.9 | +.55 / −2.2 | +0.6 / −2.8 | 114 | 255 | 69 | 2.7 |
| 4.0V | +1.6 / −1.2 | +.55 / −2.5 | +.7 / −3.2 | 103 | 250 | 71 | 2.83 |
| 4.5V | +1.65 / −1.5 | +.55 / −2.8 | +.7 / −3.5 | 93 | 240 | 72 | 3.0 |
| 5.0V | +1.65 / −1.75 | +.55 / −3.2 | +.7 / −4.0 | 85 | 230 | 73 | 3.16 |

I claim:

1. A voltage controlled oscillator circuit of the type having an astable multivibrator coupled between two voltage terminals for providing output pulses having a periodicity which varies as a function of the input voltage applied across the voltage terminals, wherein the improvement comprises:
   said astable multivibrator having a first timing network connected between first and second transistors and being responsive to the amplitude of the input voltage, and a first feedback circuit connected between an output terminal of said second transistor and an input trigger terminal of said first transistor for controlling the pulse width of said output pulses; and
   means having a second timing network connected to said input trigger terminal and being responsive to the amplitude of the input voltage and the output pulses for controlling the period between the output pulses;
   whereby the periodicity and duty cycle of the output pulses vary as a function of the input voltage.

2. A voltage controlled oscillator as in claim 1, wherein said input voltage is a DC voltage ranging from approximately 2.2 volts to 5 volts.

3. A voltage controlled oscillator as in claim 1, wherein said oscillator is adapted to provide said output pulses having a periodicity ranging from approximately 2.25 KHZ with a duty cycle of approximately 60% in response to an input voltage of approximately 2.2 volts DC to approximately 3.16 KHZ with a duty cycle of approximately 73% at approximately 5 volts DC.

4. A voltage controlled oscillator as in claim 1, wherein the first and second transistors are connected in cascade with each having a conduction path connected between said two voltage terminals.

5. A voltage controlled oscillator as in claim 1, wherein said astable multivibrator comprises the first and second transistors with the emitter terminal of said first transistor being connected to a reference voltage terminal, the collector terminal of said first transistor is connected through a first resistor to a variable voltage terminal and is further connected through a first capacitor to the base terminal of said second transistor, the base terminal of said second transistor is connected through a second resistor to said variable voltage terminal, the emitter terminal of said second transistor is connected to said reference voltage terminal, the collector terminal of said second transistor is connected through a third resistor to said variable voltage terminal and is also connected through a feedback circuit to the base of said first transistor.

6. A voltage controlled oscillator as in claim 1, wherein said second timing network comprises a capacitor having a first terminal connected to a reference voltage terminal and a second terminal connected to the collector terminal of a third transistor and connected through a resistor to a variable voltage source, said third transistor having an emitter terminal connected to said reference voltage terminal and a base terminal connected through a second feedback circuit to the collector of said second transistor.

7. A voltage controlled oscillator as in claim 6, wherein said second terminal of the capacitor is connected through a diode to said input trigger terminal.

8. A voltage controlled oscillator as in claim 7, wherein said diode and the input trigger terminal are selected to have a predetermined voltage threshold.

9. A voltage controlled oscillator as in claim 8, wherein said voltage threshold is approximately 1.8 volts DC.

10. The combination comprising:
   first and second power terminals for the application therebetween of a varying voltage;
   an astable multivibrator, having first and second transistors, the first transistor has its emitter connected to the first power terminal and its collector connected via a first resistor to said second power terminal and via a first capacitor to the base of said second transistor, the second transistor has its base connected via a second resistor to the second power terminal and its emitter connected to said first power terminal and its collector connected via a third resistor to said second power terminal and via a first feedback circuit to the base of said first transistor;
   an RC charge network, having a second capacitor and a fourth resistor connected in series between said first and second power terminals;
   a discharge network, having a third transistor with its emitter connected to the first power terminal and its collector connected to a common connection between the series connected second capacitor and fourth resistor and its base connected via a second feedback circuit to the collector of said second transistor; and
   means connected between said common connection and the base of said first transistor for coupling a voltage developed across said second capacitor to the base of said first transistor.

11. The combination as in claim 10 wherein said means comprises a diode circuit selected to have a predetermined threshold when coupled with the base of said first transistor of approximately 1.8 volts.

* * * * *